(12) United States Patent
McLachlan et al.

(10) Patent No.: US 10,211,788 B2
(45) Date of Patent: Feb. 19, 2019

(54) RESISTOR LINEARIZATION DURING CURRENT AND VOLTAGE CONVERSION

(71) Applicant: Analog Devices Global, Hamilton (BM)

(72) Inventors: Roderick McLachlan, Edinburgh (GB); Roberto Sergio Matteo Maurino, Turin (IT)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/445,389

(22) Filed: Feb. 28, 2017

(65) Prior Publication Data
US 2018/0248527 A1  Aug. 30, 2018

(51) Int. Cl.
*H03F 1/32* (2006.01)
*H03F 3/45* (2006.01)
*G05F 1/56* (2006.01)

(52) U.S. Cl.
CPC .............. *H03F 1/32* (2013.01); *G05F 1/561* (2013.01); *H03F 1/3211* (2013.01); *H03F 3/45475* (2013.01); *H03F 2203/45528* (2013.01)

(58) Field of Classification Search
CPC .......... G05F 1/561; H03F 1/32; H03F 1/3205; H03F 1/3211; H03F 1/3217; H03F 3/45475
USPC ....................................................... 327/103
See application file for complete search history.

(56) References Cited

U.S. PATENT DOCUMENTS 4,290,024 A * 9/1981 Yokoyama ............... H03F 1/56
330/105
6,198,296 B1 * 3/2001 Ivanov .................. G01D 3/021
307/131

OTHER PUBLICATIONS

"650MHz Differential ADC Driver/Dual Selectable Gain Amplifier", Linear Technology—LT6411, (2006), 16 pgs.
Ardizzoni, John, ""Rules of the Road" for High-Speed Differential ADC Drivers", Analog Dialogue, vol. 43, No. 5, (May 2009), 11 pgs.
McLachlan, Roddy C., et al., "A 20b Clockless DAC With Sub-ppm INL, 7.5 nV/vHz Noise and 0.05 ppm/° C Stability", IEEE Journal of Solid-State Circuits, vol. 48, No. 12, (Dec. 2013), 3028-3037.
McLachlan, Roddy, "Resistor Linearity in Precision R-2R DACs", [Online]. Retrieved from the Internet: <URL: home/rmclach/HTML/designnotes/tfrlinearity/reslinearity.odtAnalog Devices Proprietary, (2013), 17 pgs.
Steinmann, Philipp, et al., "Simple Analytical Model of the Thermal Resistance of Resistors in Integrated Circuits", IEEE Transactions on Electron Devices,, vol. 57, No. 5, (May 2010), 1029-1036.

* cited by examiner

*Primary Examiner* — William Hernandez
(74) *Attorney, Agent, or Firm* — Schwegman Lundberg & Woessner, P.A.

(57) ABSTRACT

A converter circuit is provided that includes an amplifier circuit and further includes: a summing current resistor that exhibits nonlinear resistance coupled between a voltage node and a summing current node of the amplifier; a compensation resistor circuit includes resistors that exhibit nonlinear resistance; the compensation resistor circuit produces a compensation current at the summing current node that compensates for nonlinear current flow in the summing current resistor.

26 Claims, 7 Drawing Sheets

RESISTOR LINEARIZATION DURING CURRENT AND VOLTAGE CONVERSION

BACKGROUND

Resistor non-linearity is a source of non-linearity in data converter circuits. A data converter circuit with an ideal resistor exhibits linear operation. However, resistor non-linearity results in data converter non-linearity.

The following expression represents linear gain within an ideal two terminal resistor, $$V(I)=IR \qquad (1)$$

In practice, resistor nonlinearity occurs due to self-heating of the resistor according to a nonzero temperature coefficient of resistance. As a resistor carries more current it dissipates power and heats up, and its resistance changes, which creates a nonlinear relationship between voltage and current. In general, the most linear type of resistor is the thin-film resistor (TFR). However, even TFRs exhibit a nonlinearity. Integrated thin film resistors in silicon dioxide ($SiO_2$), for example, are particularly prone to heating. $SiO_2$ has a very low thermal conductivity, around 100× lower than silicon, and around 200× lower than most metals. The low thermal conductivity slows heat dissipation resulting in heat-up and nonlinearity according to temperature coefficient of resistance.

SUMMARY

In one aspect, a summing current resistor that has a nonlinear resistance as a function of temperature and voltage converts a voltage to a main summing current at a summing current input of an amplifier circuit. A divider circuit includes first and second compensation resistors that have identical nominal resistances and have different geometric dimensions so that they have different nonlinear resistances as a function of temperature and voltage. A current compensation resistor converts a voltage at a divider node between the first and second compensation resistors to a compensation current at the summing current input of the amplifier circuit to compensate for nonlinearity of the summing current resistor.

In another aspect, a method is provided to convert between voltage and current. A voltage is provided to one terminal of a summing current resistor having its other terminal coupled to provide a main summing current at a summing current input node of an amplifier circuit. The summing current resistor has a non-linear voltage versus current characteristic in a parts-per-million range. A voltage is produced across a compensation voltage resistor that is a non-linear function of a voltage across the summing current resistor. A first nonlinear input current flow is produced at the summing current input node that compensates for non-linearity of the main summing current based upon the voltage across the compensation voltage resistor.

DETAILED DESCRIPTION OF EMBODIMENTS

A summing current resistor that is coupled between a voltage node and a main summing current node of an amplifier may have a nonlinear resistance that changes with temperature and voltage. A compensation resistor circuit includes resistors that also have nonlinear resistances that change with changes in temperature and voltage. The compensation resistor circuit produces a compensation current at the summing current node that compensates for non-linearity of current flow in the main summing current resistor.

More specifically, the compensation resistor circuit includes a nonlinear voltage divider that includes first and second compensation voltage resistors that have identical nominal resistances and different dimensions such that they have different nonlinear resistance behaviors as a function of at least temperature and voltage. The voltage divider produces a voltage at a divider node between the compensation resistors that changes nonlinearly with changes of temperature and voltage. A compensating current resistor is coupled to provide a nonlinear current at the summing current node in response to the nonlinear voltage at the divider node to compensate for main summing current changes within the summing current resistor due to its nonlinear resistance behavior.

Figure 1:
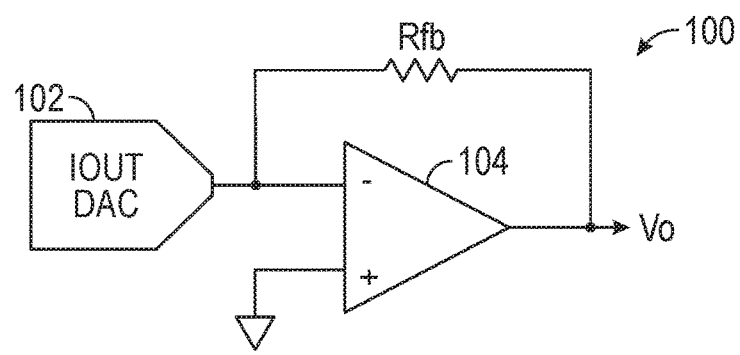
FIG. 1 is an illustrative schematic diagram representing a single-ended converter circuit.

FIG. 1 is an illustrative schematic diagram representing a single-ended converter circuit 100. An IDAC (current digital to analog converter) 102 is coupled to provide a current to an inverting node of an operational amplifier 104, which has its summing node coupled to ground. A feedback resistor $R_{fb}$ coupled between an output node of the amplifier and the amplifier inverting input node converts an output voltage $V_O$ at the output node to a current at the inverting input node. A typical feedback resistor $R_{fb}$ may have a value 100 KΩ and 800/80 dimensions (800 μm length/80 μm width), for example. A current input at the amplifier inverting node is converted to the output voltage $V_O$ at the output node.

Figure 2A:
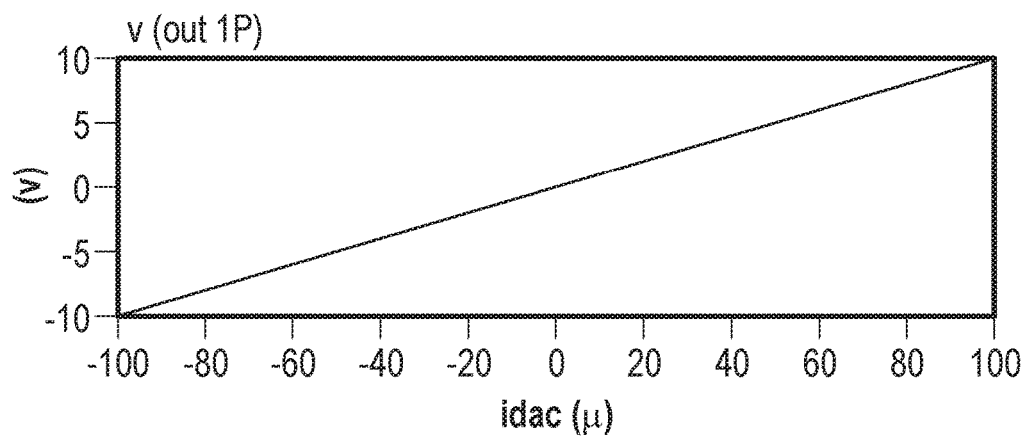
FIGS. 2A-2B are illustrative drawings representing operation of the single-ended converter circuit of FIG. 1 in which the feedback resistor exhibits non-linear operation.
Figure 2B:
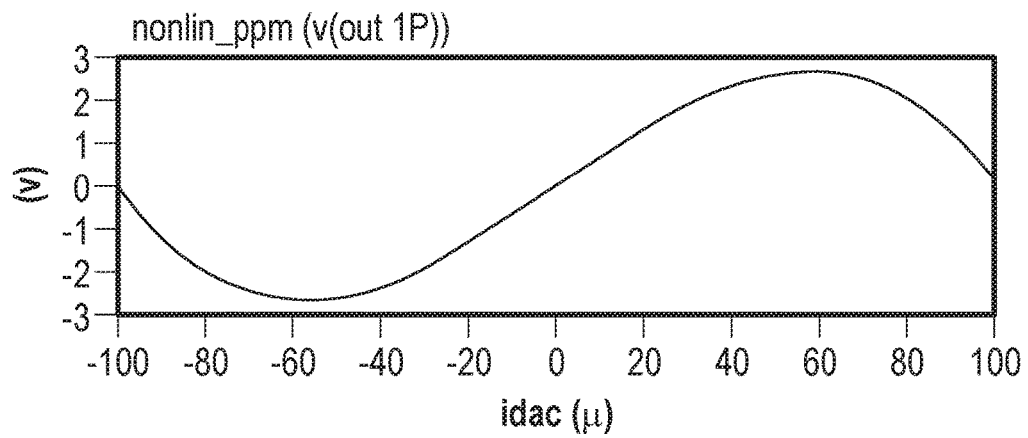

FIGS. 2A-2B are illustrative drawings representing operation of the single-ended converter circuit of FIG. 1 in which the feedback resistor exhibits non-linear operation. An IOUT DAC provides an output current which is the input to a current-to-voltage converter that includes an amplifier and feedback resistor FIG. 2A shows a current versus voltage waveform that represents approximately linear operation of the converter circuit with an input current variation of +/−100 μA resulting in an output voltage, $V_O$, range of +/−10V. It can be seen that output voltage exhibits an approximately linear operation over a 20V span extending over a range +/−10V in response to variation of input current over a +/−100 μA range. FIG. 2B is a higher resolution waveform that shows a relatively small parts-per-million (PPM) nonlinearity in the waveform of FIG. 2A. More specifically, the waveform of FIG. 2B shows an S-shaped current versus voltage waveform that represents error of up to three PPM in the output voltage, $V_O$, of FIG. 2A over the input current span of +/−100 μA caused by non-linearity of the feedback resistor $R_{fb}$.

Figure 3:
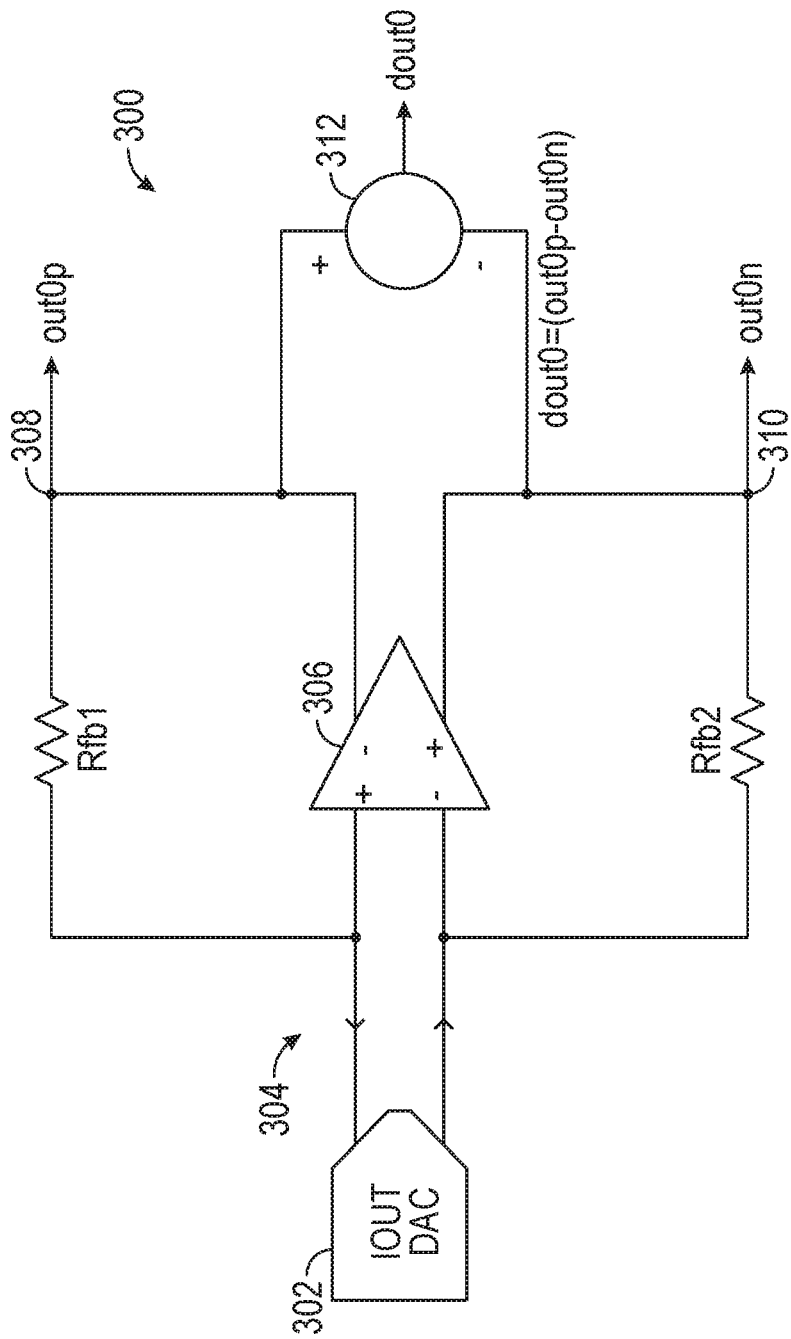
FIG. 3 is an illustrative schematic diagram representing a differential converter circuit.

FIG. 3 is an illustrative schematic diagram representing a differential converter circuit 300. An IOUT DAC 302 provides a differential output current which is an input to a current-to-voltage converter 304 that includes a differential amplifier 306 and feedback resistors $R_{fb1}$, $R_{fb2}$. An inverting output of a first differential amplifier is coupled to provide a positive output voltage, out0$p$, at a first voltage node 308 and an inverting output of the first differential amplifier is coupled to provide an inverted output voltage, out0$n$, at a second voltage node 310. A first feedback resistor $R_{fb1}$ converts the positive output voltage, out0$p$, at the first output node 308 to a current at a non-inverting current summing input node of the first amplifier 306. A second feedback resistor $R_{fb2}$ converts the inverted output voltage at the second output node 310 to a current at an inverting current summing input node of the first amplifier 306. A second differential amplifier 312 is coupled to provide an output voltage, dout0, that represents a difference between the positive and inverted output voltages, out0$p$ and out0$n$.

Figure 4A:
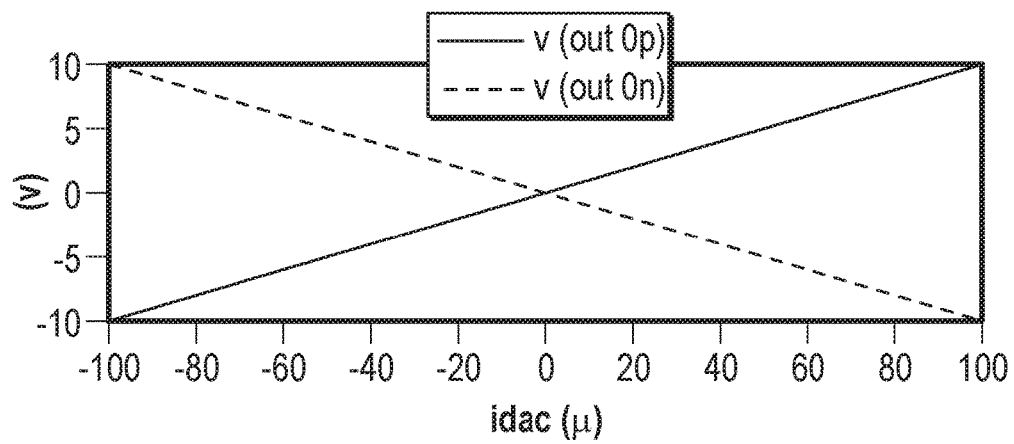
FIGS. 4A-4C are illustrative drawings representing operation of the differential converter circuit of FIG. 3 in which the first and second feedback resistors exhibit non-linear operation.
Figure 4B:
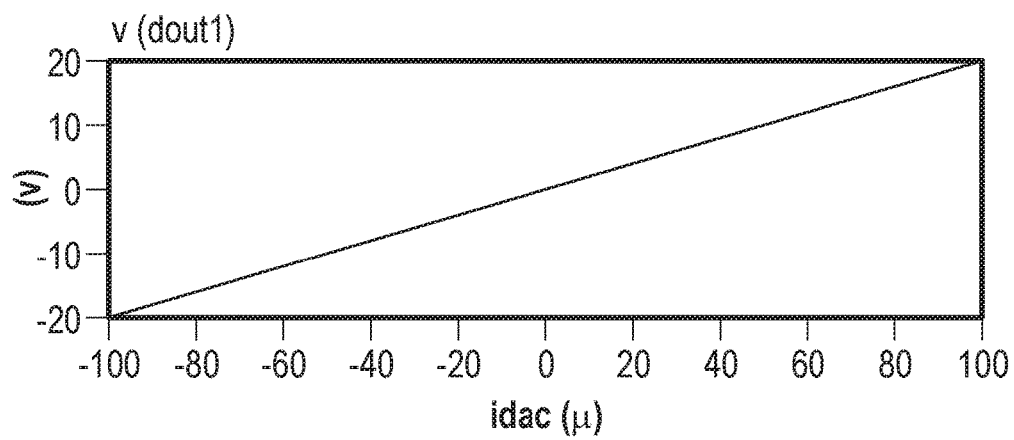
Figure 4C:
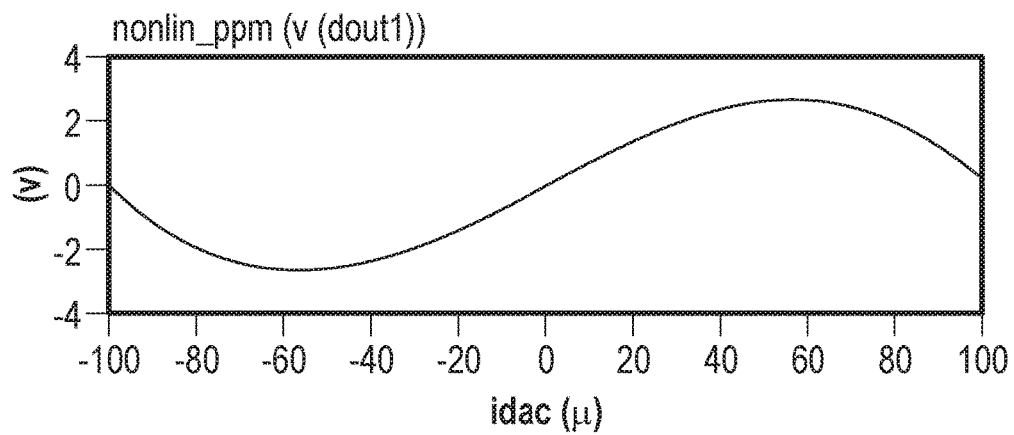

FIGS. 4A-4C are illustrative drawings representing operation of the differential converter circuit of FIG. 3 in which the first and second feedback resistors exhibit non-linear operation. FIG. 4A shows current versus voltage waveforms that represents approximate linear operation of the inverting and non-inverting sides of the differential converter circuit with input current variation of +/−100 μA resulting in inverting and non-inverting voltages having a span of +/−10V. FIG. 4B shows a current versus voltage waveform that represents approximate linear operation of the differential amplifier circuit in response to the inverting and non-inverting waveforms of FIG. 4A. FIG. 4C is a higher resolution waveform that shows a relatively small parts-per-million (PPM) nonlinearity in the waveform of FIG. 4B. More specifically, FIG. 4C shows an S-shaped current versus voltage waveform that represents error of up to three parts per million (PPM) in the differential signal waveform of FIG. 4B over the input current span of +/−100 μA caused by non-linearity of the first and second feedback resistors $R_{fb1}$ and $R_{fb2}$.

Figure 5:
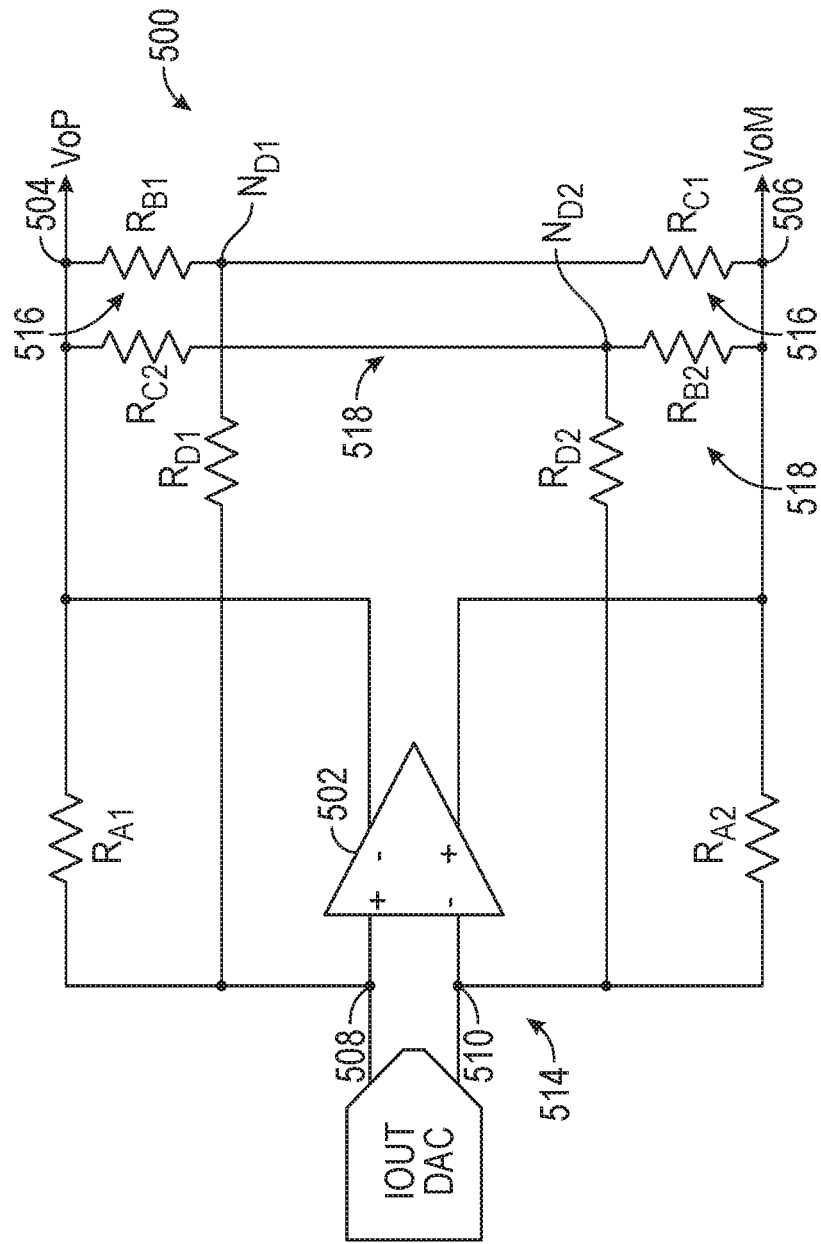
FIG. 5 is an illustrative schematic diagram representing a differential current to voltage converter output interface stage circuit.

FIG. 5 is an illustrative schematic diagram representing a differential current to voltage converter output interface stage circuit 500 in accordance with some embodiments. The differential current to voltage converter 500 can be used as the output interface stage of a DAC, for example. The converter output interface stage 500 includes a differential voltage amplifier circuit 502 that provides a positive first voltage output $V_OP$ at a first output node 504 and provides an inverted second voltage output $V_ON$ at a second output node 506.

A first main summing current resistor $R_{A1}$ is coupled between the first voltage output node 504 and a first summing current input node 508 of the first amplifier 502 to convert the first voltage $V_OP$ at the first voltage output node 504 to a first main summing current input current at the first main summing current input node 508 of the first amplifier. As explained more fully below, the first main summing resistor $R_{A1}$ may have a nonlinear behavior such that a voltage across $R_{A1}$ has a nonlinear relationship to a current through $R_{A1}$. A second main summing current resistor $R_{A2}$ is coupled between the second voltage output node 506 and a second summing current input node 510 of the first amplifier 502 to convert the second voltage $V_ON$ at the second voltage output node 506 to a second main summing current input current at the second main summing current input node 510 of the first amplifier. The second main summing resistor $R_{A2}$ may have a nonlinear behavior such that a voltage across $R_{A2}$ has a nonlinear relationship to a current through $R_{A2}$. An IOUT DAC 512 provides the current to a current-to-voltage converter portion 514 of the circuit 500.

A first compensation resistor circuit includes a first voltage compensation resistor $R_{B1}$, a second voltage compensation resistor $R_{C1}$ and a first current compensation resistor $R_{D1}$. More particularly, a first voltage divider circuit 516 includes the first voltage compensation resistor $R_{B1}$ and the second voltage compensation resistor $R_{C1}$ coupled in series between the first voltage node 504 and the second voltage node 506. A first divider node $N_{D1}$ is disposed between them. The first voltage compensation resistor $R_{B1}$ is coupled between the first voltage node and the first divider node $N_{D1}$. The second voltage compensation resistor $R_{C1}$ is coupled between the first divider node $N_{D1}$ and the second voltage node. The first current compensation resistor $R_{D1}$ is coupled between the first divider node $N_{D1}$ and the first summing current input node 508 of the first amplifier 502 to convert a first divider voltage $V_{D1}$ at the first voltage divider node $N_{D1}$ to a first compensating current flow at the first summing current input node 508 of the first amplifier 502.

A second compensation resistor circuit includes a third voltage compensation resistor $R_{B2}$, a fourth voltage compensation resistor $R_{C2}$ and a second current compensation resistor $R_{D2}$. More specifically a second nonlinear voltage divider circuit 518 includes the third voltage compensation resistor $R_{B2}$ and the fourth voltage compensation resistor $R_{C2}$ coupled in series between the first voltage node 504 and the second voltage node 506. A second divider node $N_{D2}$ is disposed between them. The third voltage compensation resistor $R_{B2}$ is coupled between the second voltage node and the second divider node $N_{D2}$. The fourth voltage compensation resistor $R_{C2}$ is coupled between the second divider node $N_{D2}$ and the first voltage node. The second current compensation resistor $R_{D2}$ is coupled between the second divider node $N_{D2}$ and the second summing current input node 510 of the first amplifier 502 to convert a second divider voltage $V_{D2}$ at the second voltage divider node $N_{D2}$ to a second compensating current flow at the second summing current input node 510 of the first amplifier 502.

Each of the resistors in the differential current to voltage converter circuit 500 has a non-zero temperature coefficients of resistance. In some embodiments, each of the resistors of the differential current to voltage converter circuit is a thin-film resistor (TFR). The temperature of a resistor, and therefore its resistance, varies with current flow through the resistor. More particularly, temperature, and therefore its resistance, varies with power density due to current flow within the resistor.

The following expression indicates a functional relationship between resistance and voltage that results in nonlinear current versus voltage characteristic of a resistance, $$R(V) = R_o \left\{ 1 + \frac{\theta_a \cdot K}{\rho \cdot L^2} V^2 \right\} \quad (2)$$

$R_0$=nominal resistance; $\theta_a$=Thermal resistance per unit area: K=Temperature coefficient of resistance; $\rho$=Sheet Resistivity; L=Resistor Length; V=Voltage.

The non-linear term, $$\frac{\theta_a \cdot K}{\rho \cdot L^2} V^2 \quad (3)$$

contains a fixed value component, $$\frac{\theta_a \cdot K}{\rho \cdot L^2} \quad (4)$$

and a variable component, $V^2$, which varies during operation.

Thus each resistor has a resistor value that is a linear function of its nominal resistance $R_0$ and that is a nonlinear function of the fixed value component, which includes a length dimension, L, and of a variable component, the square of the voltage across it.

It will be appreciated that the value of the nonlinear term is proportional to Power/Area (i.e. Power Density) within a resistor. Thus, for any given voltage, a reduced resistor area results in larger power density and increased nonlinearity. Therefore, the smaller the area of a resistor, the greater the non-linearity of its resistance value. Moreover, in differential embodiments, resistance varies nonlinearly according to an S-shaped current versus voltage characteristic. In single-ended embodiments resistance varies nonlinearly according to one-half of an S-shape, which has bow shape current versus voltage characteristic.

The resistances of the first and second main summing current resistors $R_{A1}$ and $R_{A2}$ vary nonlinearly as a function of voltage as described above. The first nonlinear voltage divider circuit 516 and the first current compensation feedback current resistor $R_{D1}$ produce a current at the first summing current input node 508 of the first amplifier 502 that compensates for nonlinearities in current flow though the first main summing current resistor $R_{A1}$ due to variations in voltage across $R_{A1}$. The second nonlinear voltage divider circuit 518 and the second current compensation feedback current resistor $R_{D2}$ produce a current at the second summing current input node 510 of the first amplifier 502 that compensates for nonlinearities in current flow though the second main summing current resistor $R_{A2}$ due to variations in voltage across $R_{A2}$.

In some embodiments, the first and second main summing current resistors $R_{A1}$ and $R_{A2}$ have the same area and therefore, the same self-heating and power density for any given voltage across them. The first voltage output $V_0P$ at a first output node 504 and the second voltage output $V_0N$ at a second output node 506 together form a differential signal, with a common mode voltage that has no nonlinear dependence on the input signal IDAC and IDAC-bar.

More specifically, the first voltage compensation resistor $R_{B1}$ the second voltage compensation resistor $R_{C1}$ have nominally equal resistance, and the first voltage divider provides a common mode voltage, $(V_{OP}+V_{OM})/2$ at the first divider node $N_{D1}$. Similarly, the third voltage compensation resistor $R_{B2}$ the fourth voltage compensation resistor $R_{C2}$ have nominally equal resistance, and the second voltage divider provides the common mode voltage, $(V_{OP}+V_{OM})/2$ at the second divider node $N_{D2}$.

The second voltage compensation resistor $R_{C1}$ is physically smaller than first voltage compensation resistor $R_{B1}$ by an area scaling factor, 'ASCALE', in both the width and the length, so that $R_{C1}$ will have (ASCALE*ASCALE) as much power density as first compensating resistor $R_{B1}$. Similarly, the fourth voltage compensation resistor $R_{C2}$ is physically smaller than third voltage compensation resistor $R_{B2}$ by the factor of 'ASCALE' in both the width and the length, so that $R_{C2}$ will have (ASCALE*ASCALE) as much power density as first compensating resistor $R_{B2}$.

It will be understood that nominal resistance of a resistor increases with resistor length (L) and decreases with resistance width (W), and therefore, changing both the width and the length in the same proportion results in no change in nominal resistance. However, it will be understood from the expression (2) above that decreasing the length (L) increases the nonlinearity of the second and fourth voltage compensation resistors $R_{C1}$ and $R_{C2}$ by a factor of $1/L^2$ Thus, both the first resistor divider circuit 516 formed by the first and second voltage compensation resistors $R_{B1}$ and $R_{C1}$ and the second resistor divider circuit 518 formed by the third and fourth voltage compensation resistors $R_{B2}$ and $R_{C2}$ are nonlinear. More particularly, the larger the value of ASCALE the larger will be the nonlinearity of voltage versus current of the second and fourth voltage compensation resistors $R_{C1}$ and $R_{C2}$ relative to that of the first and third voltage compensation resistors $R_{B1}$ and $R_{B2}$ and relative to that of the first and second main summing current resistors $R_{A1}$ and $R_{A2}$. The resistance nonlinearities of the second and fourth voltage compensation resistors $R_{C1}$ and $R_{C2}$ have a characteristic S-shape that is the same as, though more pronounced than, that of the first and second main summing current resistors $R_{A1}$ and $R_{A2}$. Due to the increased nonlinearity of voltage versus current the second voltage compensation resistor $R_{C1}$ relative to the first voltage compensation resistor $R_{B1}$, there is a nonlinear relationship between voltage and current at the first voltage divider node $N_{D1}$. Likewise, due to the increased nonlinearity of voltage versus current of the fourth voltage compensation resistor $R_{C2}$ relative to the third voltage compensation resistor $R_{B2}$, there is a nonlinear relationship between voltage and current at the second voltage divider node $N_{D2}$.

The first divider voltage $V_{D1}$ has a value that changes nonlinearly with changes in the value of $V_{OP}$ at a first output node. Similarly, the second divider voltage $V_{D2}$ has a value that changes nonlinearly with changes in the value of $V_{OM}$ at a second output node. More particularly, the divider voltage $V_{D1}$ and $V_{D2}$ vary in a nonlinear manner which is similar but amplified compared to the original non-linearity that is to be corrected.

The first current compensation resistor $R_{D1}$ converts the first divider voltage $V_{D1}$ to the first compensating feedback current at the first summing current input node 508 of the first amplifier 502. More particularly, some current that would ordinarily pass through first main summing current resistor $R_{A1}$ will instead pass through first current compensation resistor $R_{D1}$ and with an appropriate selection of a resistance value for $R_{D1}$, this first compensation current will compensate for the resistance nonlinearity of the first main summing current resistor $R_{A1}$. The same holds for a second compensation current through the second current compensation resistor RD2, which will compensate for the resistance nonlinearity of the second main summing current resistor $R_{A2}$.

The second compensating feedback current resistor $R_{D2}$ converts the second divider voltage $V_{D2}$ to the second compensating feedback current at the second summing current input node 510 of the first amplifier 502. The third and fourth compensating resistors $R_{B2}$ and $R_{C2}$ perform similar roles that will be understood from the discussion above. Thus, the second compensating feedback current resistor $R_{D2}$ operates in a similar manner to convert the voltage at the second divider node $N_{D2}$ to a compensating voltage that compensates for changes in current flow through the second main summing current resistor $R_{A2}$.

Although the first and second voltage compensation resistors $R_{B1}$ and $R_{C1}$ and the third and fourth voltage compensation resistors $R_{B2}$ and $R_{C2}$ have nominally equal resistance values, they need not be the same nominal resistance value as the first and second main summing current resistors $R_{A1}$ and $R_{A2}$. The power dissipation through the voltage compensation resistors, $R_{B1}$, $R_{C1}$, $R_{B2}$, $R_{C2}$ can be decreased by scaling up their resistances by a resistance scaling factor of RSCALE>1.0. Scaling according to RSCALE has the effects of decreasing the total power consumption of the circuit and decreasing the total area of the resistors used in the circuit. Both power and area reduction are usually desirable. In accordance with some embodiments, the lengths of the first and third compensating resistors $R_{B1}$ and $R_{B2}$ is selected to be the same as that of the first main summing current resistors $R_{A1}$ and $R_{A2}$ so as to maintain them as substantially linear, but scale the width down by RSCALE to reduce power dissipation. The size of the second and fourth compensating resistors $R_{C1}$ and $R_{C2}$ is scaled to be smaller than the first and third compensating resistors $R_{B1}$ and $R_{B2}$ by the ASCALE factor described above to make $R_{C1}$ and $R_{C2}$ nonlinear compared to $R_{B1}$ and $R_{B2}$.

In accordance with some embodiments, the first and second compensating feedback current resistors $R_{D1}$ and $R_{D2}$ have resistance values scaled to the resistance values of the first and second main summing current resistors $R_{A1}$ and $R_{A2}$ using a scaling factor that includes ASCALE and RSCALE as follows:

$$R_{D1} = R_{A1} \times \{[ASCALE \times ASCALE - RSCALE - 1]/2\} \quad (6)$$

The second compensating feedback current resistors $R_{D2}$ is similarly scaled based upon the second main summing current resistor value $R_{A2}$.

It is noted that choosing a large ASCALE ratio, results in an increased value of resistors $R_{D1}$ and $R_{D2}$ and hence keep the noise and offset contribution of the cancellation circuit to be insignificant compared to the main summing current signal path. In some embodiments, a realizable practical value of ASCALE is four (4), in which case, assuming that RSCALE=1, the impedance through $R_{D1}$ and $R_{D2}$ will be 7× the resistance $R_{A1}$ and $R_{A2}$, with noise attenuated accordingly. Moreover, it will be appreciated that the dimensions of the first and second compensating current resistors $R_{D1}$ and $R_{D2}$ are generally are not critical; they have negligible voltage or power and might as well be low area. It will be understood that $R_{D1}$ and $R_{D2}$ are adjusted by RSCALE/2 to obtain the same impedance looking into resistor $R_{D1}$ and $R_{D2}$, respectively, if RSCALE is not equal to one. For example, if we keep a practical value ASCALE=4, and increase RSCALE to five (5) (for better power and area, for example), then $R_{D1}$ and $R_{D2}$ will be five times $R_{A1}$ and $R_{A2}$.

Figure 6A:
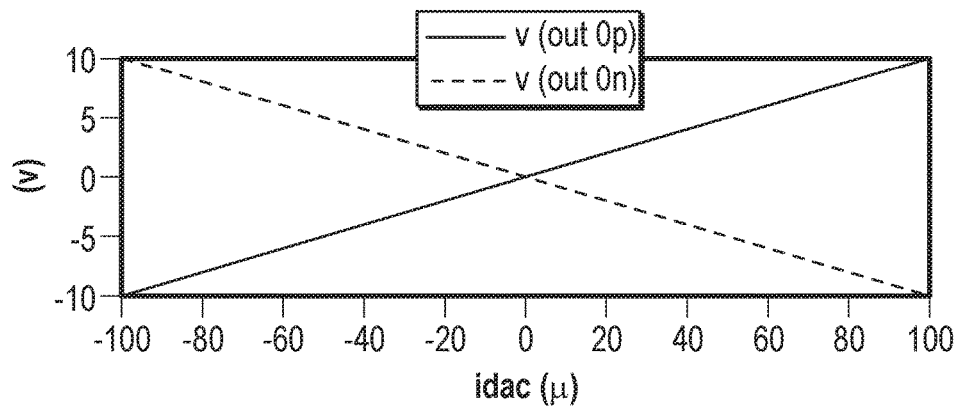
FIGS. 6A-6C are illustrative drawings representing operation of the differential current to voltage converter circuit of FIG. 5 showing nonlinear compensation for nonlinear operation of first and second feedback resistors.
Figure 6B:
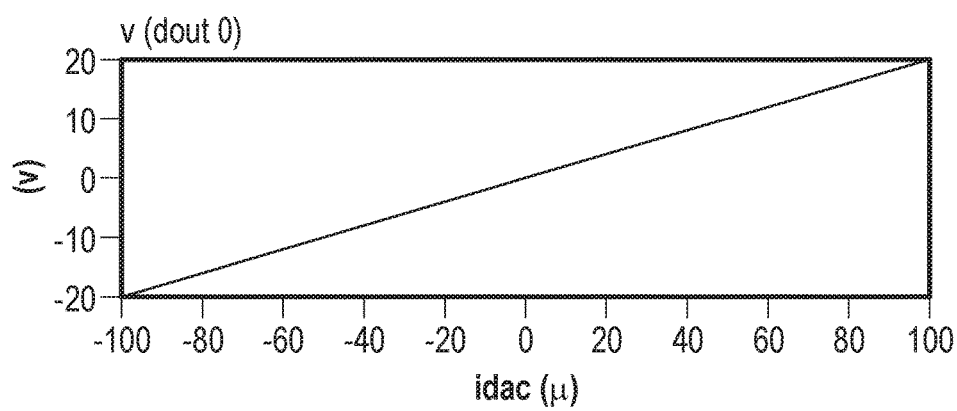
Figure 6C:
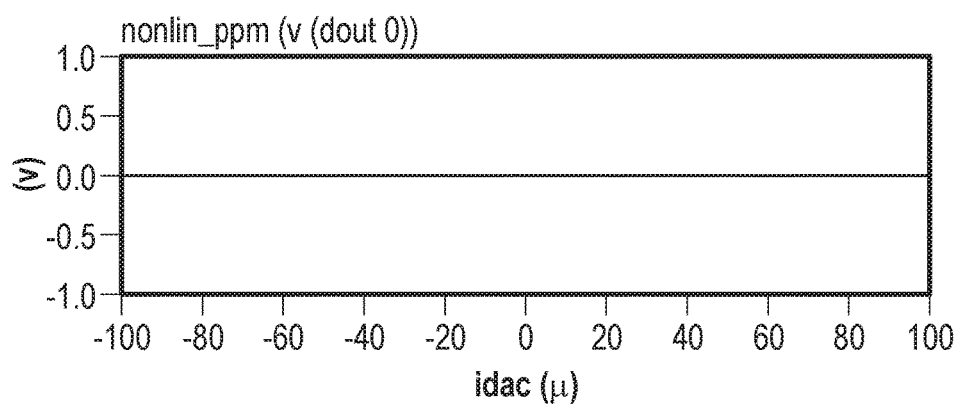

FIGS. 6A-6C are illustrative drawings representing operation of the differential current to voltage converter circuit of FIG. 5 showing nonlinear compensation for nonlinear operation of first and second main summing current resistors $R_{A1}$, $R_{A2}$ in accordance with some embodiments. FIG. 6A shows current versus voltage waveforms that represents linear operation of the inverting and non-inverting sides of the differential current to voltage converter circuit with input current variation of +/−100 µA resulting in inverting and non-inverting voltages having a span of +/−10V. FIG. 6B shows a current versus voltage waveform that represents a linear common mode voltage for the waveforms of FIG. 6A. FIG. 6C is a higher resolution waveform in PPM that shows a flat current versus voltage waveform over the input current span of +/−100 µA despite non-linearity of the first and second main summing current resistors $R_{A1}$ and $R_{A2}$.

Figure 7:
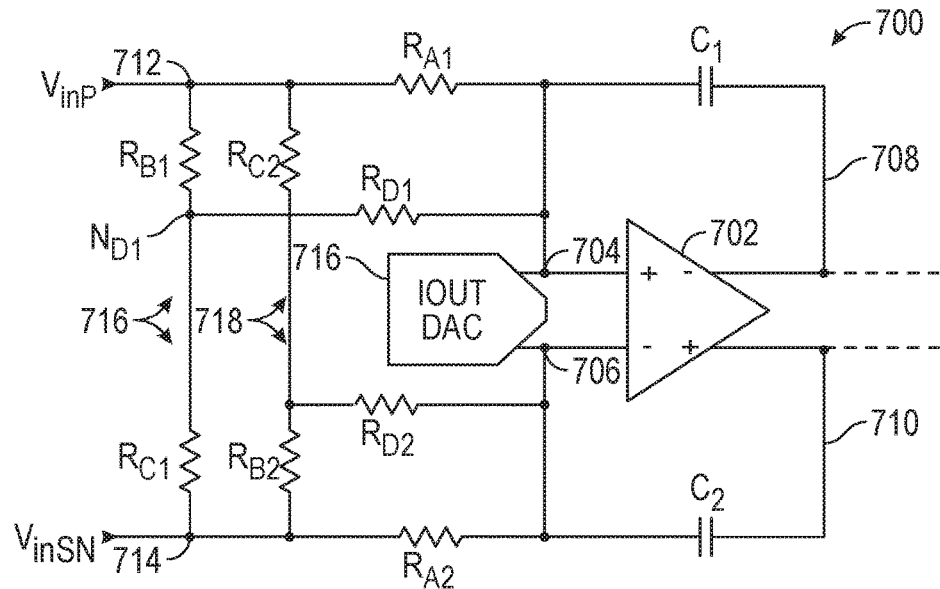
FIG. 7 is an illustrative schematic diagram representing a differential voltage to current converter input interface stage circuit.

FIG. 7 is an illustrative schematic diagram representing a differential voltage to current converter input interface stage circuit 700 in accordance with some embodiments. The differential voltage to current converter 700 can be used as an input interface stage to an analog to digital converter (ADC), for example, where signals arrive and enter the ADC. A differential integrating amplifier 702 includes a noninverting first current summing input node 704 and an inverting second current summing input node 706. A first capacitor C1 is coupled between an inverting first output 708 of the differential amplifier 702 and its noninverting first current summing input node 704 to provide a first integrating voltage its first voltage output 708. A second capacitor C2 is coupled between a noninverting second output 710 of the differential amplifier 702 and its inverting second current summing input node 706 to provide a second integrating voltage at its second output voltage 710. A first main summing current resistor $R_{A1}$ is coupled between a first voltage input node 712 that has an input voltage VinP and the first current summing input node 704. A second main summing current resistor $R_{A2}$ is coupled between a second voltage input voltage node 714 that has an input voltage VinN and the second current summing input node 706. The main summing current resistors $R_{A1}$ and $R_{A2}$ convert the voltages VinP and VinN into respective currents that are integrated onto the respective first and second capacitors, C1 and C2.

In this illustrative circuit 700, an IOUT DAC 716 operates under digital control (not shown), and its digital inputs are adjusted in a manner dependent on a voltage that is integrated onto capacitors C1 and C2. In essence, conversion involves continued adjusting of the digital codes going into the IOUT DAC 716 in a manner that minimizes the integrated voltage on C1 and C2 (i.e.: the IOUT DAC current cancels the integrating current due to the input voltage), and then if an average is determined for all the digital values that are input into a DAC (not shown), an accurate indication of the average input voltage is obtained. Such conversion forms no part of the invention and will not be further described herein.

A first nonlinear voltage divider circuit 716 includes a first voltage compensation resistor $R_{B1}$ and a second voltage compensation resistor $R_{C1}$ coupled in series between the first and second input voltage nodes 712, 714. A first divider node $N_{D1}$ is disposed between them. The first voltage compensation resistor $R_{B1}$ is coupled between the first input voltage node 712 and the first divider node $N_{D1}$. The second voltage compensation resistor $R_{C1}$ is coupled between the first divider node $N_{D1}$ and the second input voltage node 714. A first current compensation resistor $R_{D1}$ is coupled between the first divider node $N_{D1}$ and the first current summing input node 704 of the amplifier circuit 702 to convert a first divider voltage $V_{D1}$ at the first voltage divider node $N_{D1}$ to a first compensating current flow at the first current summing input node 704 of the differential amplifier circuit 702.

A second nonlinear voltage divider circuit 718 includes a third voltage compensation resistor $R_{B2}$ and a fourth voltage compensation resistor $R_{C2}$ coupled in series between the first and second input voltage nodes 712, 714. A second divider node $N_{D2}$ is disposed between them. The third voltage compensation resistor $R_{B2}$ is coupled between the second input voltage node 714 and the second divider node $N_{D2}$. The fourth voltage compensation resistor $R_{C2}$ is coupled between the second divider node $N_{D2}$ and the first input voltage node 712. A second current compensation resistor $R_{D2}$ is coupled between the second divider node $N_{D2}$ and the inverting second current summing input node 706 of the amplifier circuit 702 to convert a second divider voltage $V_{D2}$ at the second voltage divider node $N_{D2}$ to a second compensating current flow at the inverting second current summing input node 706.

Each of the resistors in the differential voltage to current converter circuit has a non-zero temperature coefficients of resistance. The dimensions and roles of the main summing current resistors $R_{A1}$, $R_{A2}$, voltage compensation resistors $R_{B1}$, $R_{B2}$, $R_{C1}$, $R_{C2}$, and current compensating resistors $R_{D1}$, $R_{D2}$, in the differential voltage to current converter circuit are equivalent to corresponding resistors described above with reference to FIG. 5. The operation of these resistors, therefore, will be understood from the discussion above.

Figure 8:
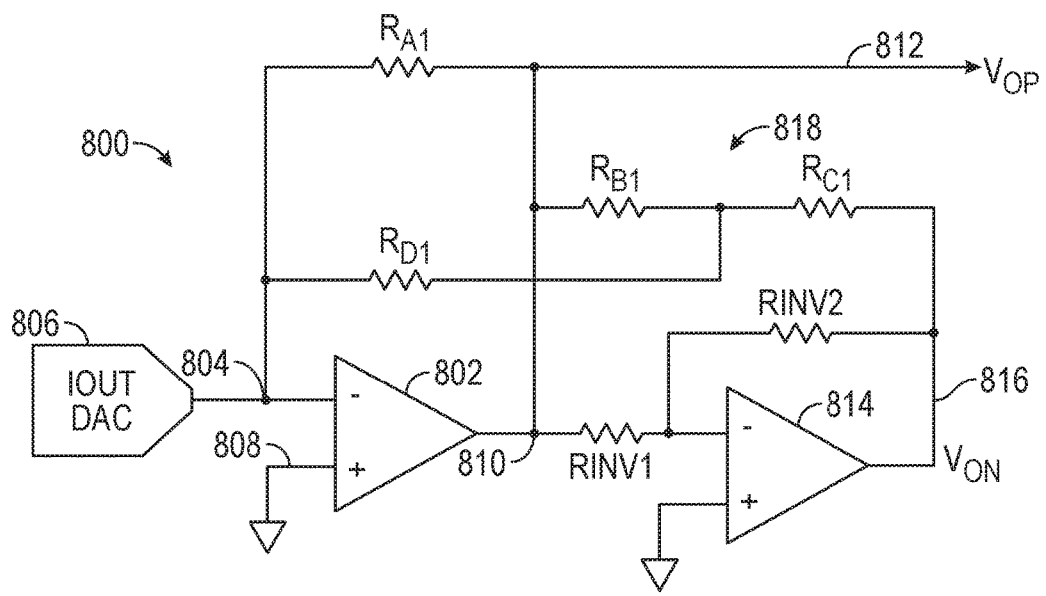
FIG. 8 is an illustrative schematic diagram representing a single-ended current to voltage converter output interface stage circuit.

FIG. 8 is an illustrative schematic diagram representing a single-ended current to voltage converter input interface (front end) circuit 800 in accordance with some embodiments. The single-ended current to voltage converter 800 can be used as the voltage output interface stage of a DAC. A single-ended amplifier 802 includes an inverting first current summing input node 804 coupled to receive an input current IOUT DAC 806, which provides the current to the current-to-voltage converter 800 and includes a second current summing input node 808 coupled to ground and includes an output node 810 coupled to provide a first voltage value $V_{OP}$ at a first output node 812. A second amplifier circuit 814 includes is coupled to first and second inverting resistors $R_{INV1}$, $R_{INV2}$ coupled to configure it to function as an operational amplifier inverter that provides a voltage value $V_{ON}$ at a second output node 816 that is an inverted version of the first input voltage input value $V_{OP}$.

A main summing current resistor $R_{A1}$ is coupled between the first output voltage node 812 and the inverting first current summing input node 804 of the single-ended first amplifier. A nonlinear voltage divider circuit 818 includes a first voltage compensation resistor $R_{B1}$ and a second voltage compensation resistor $R_{C1}$ coupled in series between the first output voltage node, which has the voltage $V_{OP}$, and the second output node, which has the voltage $V_{OP}$. A first divider node $N_{D1}$ is disposed between the first and second voltage compensation resistors $R_{B1}$ and $R_{C1}$. The first voltage compensation resistor $R_{B1}$ is coupled between the first output voltage node 812 and the first divider node $N_{D1}$. The second voltage compensation resistor $R_{C1}$ is coupled between the first divider node $N_{D1}$ and the second output node 816. A first current compensation resistor $R_{D1}$ is coupled between the first divider node $N_{D1}$ and the inverting first current summing input node 804 of the first amplifier circuit 802 to convert a first divider voltage $V_{D1}$ at the first voltage divider node $N_{D1}$ to a first compensation current flow at the inverting first current summing input node 804 of the amplifier circuit 802.

Each of the resistors in the single ended current to voltage converter circuit 800 has a non-zero temperature coefficients of resistance. The dimensions and roles of the main summing current resistor $R_{A1}$, voltage compensation resistors $R_{B1}$, and $R_{C1}$, and current compensation resistor $R_{D1}$, in the single ended current to voltage converter front end circuit 800 are equivalent to corresponding resistors described above with reference to FIG. 5. The operation of these resistors, therefore, will be understood from the discussion above.

Figure 9:
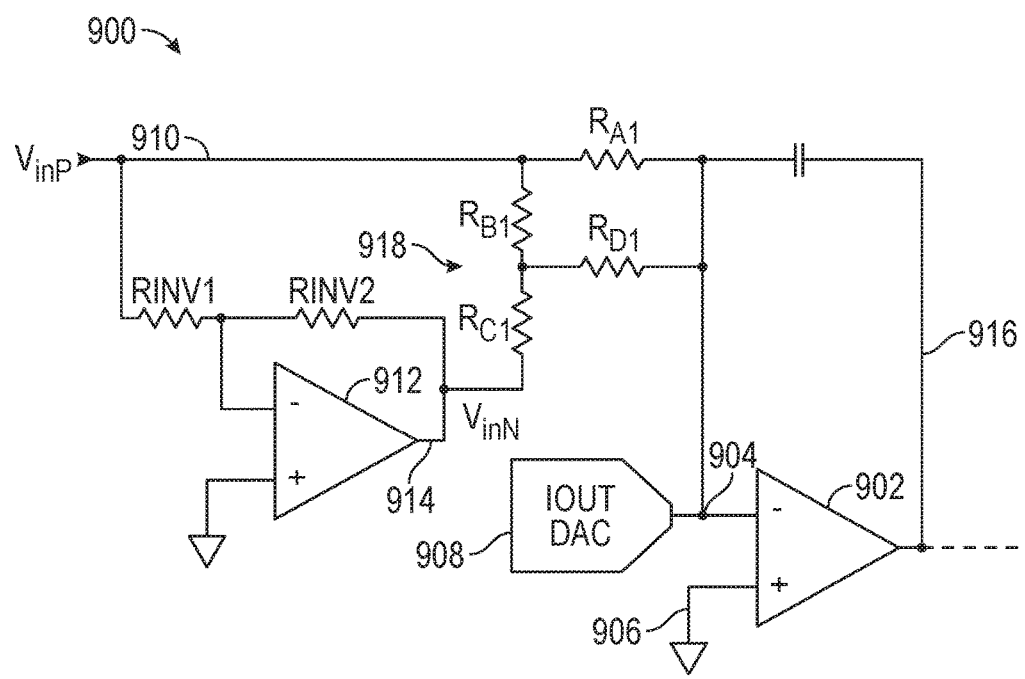
FIG. 9 is an illustrative schematic diagram representing a single-ended voltage to current converter input interface stage circuit.

FIG. 9 is an illustrative schematic diagram representing a single-ended voltage to current converter input interface (front end) circuit 900 in accordance with some embodiments. The single-ended voltage to current converter 900 can be used as the input stage or "front-end" to a ADC, for example. A single-ended integrating first amplifier 902 includes an inverting first current summing input node 904 coupled to receive an input current IOUT and includes a second current summing input node 906 coupled to ground. An IOUT DAC 908 provides a current which is programmed to cancel the current from the input signal, and processing (essentially averaging) the digital codes which were selected to do this cancellation provides a digital indication of the ADC's input signal, and hence the conversion to digital. A main summing current resistor $R_{A1}$ is coupled between a first input voltage node 910 that has a voltage $V_{inP}$ and the inverting first summing current input node 904 of the first amplifier 902. The main resistor $R_{A1}$ converts the first voltage $V_{inP}$ to a main summing current that flows to the inverting first summing current input node 904. A second amplifier 912 is coupled to first and second resistors $R_{INV1}$, $R_{INV2}$ to configure it to function as an amplifier inverter that provides at a second node 914 a second voltage $V_{inN}$ that is an inverted version of the first voltage $V_{inP}$. A first capacitor C1 is coupled between the output 916 of the single-ended first amplifier 902 and its inverting first current summing input node 904 to provide an integrating voltage at its voltage output 916.

A nonlinear voltage divider circuit 918 includes a first voltage compensation resistor $R_{B1}$ and a second voltage compensation resistor $R_{C1}$ coupled in series between the first and second voltage nodes. A first divider node $N_{D1}$ is disposed between the first and second voltage compensation resistors $R_{B1}$ and $R_{C1}$. The first voltage compensation resistor $R_{B1}$ is coupled between the first input voltage node and the first divider node $N_{D1}$. The second voltage compensation resistor $R_{C1}$ is coupled between the first divider node $N_{D1}$ and the output node of the second amplifier (inverter) circuit 914. A first current compensation resistor $R_{D1}$ is coupled between the first divider node $N_{D1}$ and the first summing current input node 904 to convert a first divider voltage $V_{D1}$ at the first voltage divider node $N_{D1}$ to a first compensating current flow at the first summing current input node 904 of the single-ended first amplifier circuit 902.

Each of the resistors in the single ended voltage to current converter circuit 900 has a non-zero temperature coefficients of resistance. The dimensions and roles of the first main summing current resistor $R_{A1}$, voltage compensation resistors $R_{B1}$, and $R_{C1}$, and current compensation resistor $R_{D1}$, in the single ended voltage to current converter circuit are equivalent to corresponding resistors described above with reference to FIG. 5. The operation of these resistors, therefore, will be understood from the discussion above.

The above description is presented to enable any person skilled in the art to create and use resistor linearization compensation circuitry conversion circuitry used to convert between current and voltage. Various modifications to the embodiments will be readily apparent to those skilled in the art, and the generic principles defined herein may be applied to other embodiments and applications without departing from the spirit and scope of the invention. In the preceding description, numerous details are set forth for the purpose of explanation. However, one of ordinary skill in the art will realize that the resistor linearization compensation circuitry might be practiced without the use of these specific details. In other instances, well-known processes are shown in block diagram form in order not to obscure the description of the invention with unnecessary detail. Identical reference numerals may be used to represent different views of the same or similar item in different drawings and in the specification. Thus, the foregoing description and drawings of embodiments in accordance with the present invention are merely illustrative of the principles of the invention. Therefore, it will be understood that various modifications can be made to the embodiments by those skilled in the art without departing from the spirit and scope of the invention, which is defined in the appended claims.

The invention claimed is:

1. A converter circuit which converts between voltage and current, comprising:
    a first amplifier circuit;
    a first main summing current resistor coupled between a first voltage node at a first voltage and a first summing current input node of the first amplifier circuit to provide a first main summing current at the first summing current input node;
    a first non-linear voltage divider circuit including a first voltage compensation resistor having a first nominal resistance value and a first length dimension, and a second voltage compensation resistor having the first nominal resistance value and a second length dimension that is less than the first length dimension, wherein the first and second resistors are coupled in series between the first voltage node and a second voltage node with a first divider node disposed between them, wherein the second voltage node is at a second voltage that is an inverted version of the first voltage; and
    a first current compensation resistor coupled between the first divider node and the first summing current input node to provide a first compensation input current flow at the first summing current input node in response to a first divider voltage at the first divider node.

2. The converter circuit of claim 1,
    wherein the first main summing current resistor, the first and second voltage compensation resistors and the first current compensation resistor are thin film resistors.

3. The converter circuit of claim 1,
    wherein the first current compensation resistor is scaled in size based upon a size of the first main summing current resistor.

4. The converter circuit of claim 1,
    wherein the first amplifier circuit is coupled to provide the first voltage at the first voltage node.

5. The converter circuit of claim 4,
    wherein the first amplifier circuit includes a single ended amplifier; further including:
    an inverter circuit coupled to provide the second voltage at the second voltage node.

6. The converter circuit of claim 5,
    wherein the inverter circuit includes a second amplifier circuit.

7. The converter circuit of claim 4,
    wherein the first amplifier circuit includes a differential output signal that is coupled to provide the second voltage at the second voltage node; further including:
    a second main summing current resistor coupled between the second voltage node and a second summing current input node of the first amplifier circuit to provide a second main summing input current at the second summing current input node;
    a second non-linear voltage divider circuit including a third voltage compensation resistor having a second nominal resistance value and a third length dimension, and a fourth voltage compensation resistor having the second nominal resistance value and a fourth length dimension that is less than the third length dimension, wherein the third and fourth resistors are coupled in series between the first voltage node and the second voltage node with a second divider node disposed between them; and
    a second current compensation resistor coupled between the second divider node and the second summing current input node to provide a second compensation input current flow at the second summing current input node in response to a second divider voltage at the second divider node.

8. The converter circuit of claim 7,
    wherein the first nominal resistance value matches the second nominal resistance value.

9. The converter circuit of claim 7,
    wherein the first length dimension matches the third length dimension; and
    wherein the second length dimension matches the fourth length dimension.

10. The converter circuit of claim 7,
    wherein the first voltage compensation resistor is coupled between the first voltage node and the first divider node and the second voltage compensating resistor is coupled between the first divider node and the second voltage node; and
    wherein the third voltage compensation resistor is coupled between the second voltage node and the second divider node and the fourth voltage compensating resistor is coupled between the second divider node and the first voltage node.

11. The converter circuit of claim 1 further including:
    a first capacitor coupled between the first summing current input node and a first output of the first amplifier circuit to provide a first integrating voltage at the first output of the first amplifier circuit.

12. The converter circuit of claim 11,
    wherein first amplifier includes a single ended amplifier; further including:
    an inverter circuit coupled to provide the second voltage at the second voltage node.

13. The converter circuit of claim 12,
    wherein the inverter circuit includes a second amplifier circuit.

14. The converter circuit of claim 11,
    wherein the first amplifier circuit includes a differential output signal coupled to provide the second voltage at the second voltage node; further including:
    a second main summing current resistor coupled between the second voltage node at the second voltage and a second summing current input node of the first amplifier circuit to provide a second main summing current input signal at the second summing current input node; and
    a second capacitor coupled between the second summing current input node and a second output of the first amplifier circuit to provide a second integrating voltage at the second output of the first amplifier circuit;
    a second non-linear voltage divider circuit including a third voltage compensation resistor, having a second nominal resistance value and a third length dimension, and a fourth voltage compensation resistor having the second nominal resistance value and a fourth length dimension that is less than the third length dimension, wherein the third and fourth resistors are coupled in series between the first voltage node and the second voltage node with a second divider node disposed between them; and a second current compensation resistor coupled between the second divider node and the second summing current input node to provide a second compensation input current flow at the second summing current input node in response to a second divider voltage at the second divider node.

15. The converter circuit of claim 14,
wherein the first nominal resistance value matches the second nominal resistance value.

16. The converter circuit of claim 14,
wherein the first length dimension matches the third length dimension;
wherein the second length dimension matches the fourth length dimension.

17. The converter circuit of claim 14,
wherein the first voltage compensation resistor is coupled between the first voltage node and the first divider node and the second voltage compensating resistor is coupled between the first divider node and the second voltage node; and
wherein the third voltage compensation resistor is coupled between the second voltage node and the second divider node and the fourth voltage compensating resistor is coupled between the second divider node and the first voltage node.

18. The converter circuit of claim 1, wherein the first non-linear voltage divider produces a nonlinear voltage at the first divider node.

19. The converter circuit of claim 18, wherein the nonlinear voltage at the first divider node is nonlinear as a function of voltage across the first main summing current resistor, and wherein the first compensation input current flow compensates for nonlinearity of the first main summing current.

20. The converter circuit of claim 1, wherein a voltage across at least one of the first or second voltage compensation resistors is a nonlinear function of a voltage across the first main summing current resistor, and wherein the first compensation input current flow compensates for nonlinearity of the first main summing current based upon the voltage across at least one of the first or second voltage compensation resistors.

21. A converter circuit which converts between voltage and current, comprising:
an amplifier circuit;
a first main summing current resistor coupled between a first voltage node at a first voltage and a first summing current input node of the amplifier circuit to provide a first main summing current at the first summing current input node;
means for providing a first nonlinear voltage at a first node in response to current in the first main summing current resistor; and
means for providing a first nonlinear input current flow at the first summing current input node in response to the first nonlinear voltage at the first node.

22. The converter circuit of claim 21 further including:
a second main summing current resistor coupled between a second voltage node at a second voltage and a second summing current input node of the amplifier circuit to provide a second main summing current at the second summing current input node;
means for providing a second nonlinear voltage at a second node in response to current in the second main summing current resistor; and
means for providing a second nonlinear input current flow at the second summing current input node in response to the second nonlinear voltage at the second node.

23. The converter circuit of claim 21 further including a means for dividing a voltage between the first voltage node and a second voltage node, that is an inverted version of the first voltage node, to provide the first nonlinear voltage.

24. The converter circuit of claim 21 further comprising means for compensating for nonlinearity of the first main summing current based on the first nonlinear input current flow.

25. A method to convert between voltage and current, comprising:
providing a voltage to one terminal of a main summing current resistor having its other terminal coupled to provide a main summing current at a summing current input node of an amplifier circuit, wherein the main summing current resistor has a nonlinear voltage versus current characteristic;
producing a voltage across a compensation voltage resistor that is a nonlinear function of a voltage across the main summing current resistor; and
producing a nonlinear input current flow at the summing current input node that compensates for nonlinearity of the main summing current based upon the voltage across the compensation voltage resistor.

26. The method of claim 25 further comprising dividing a voltage between the voltage provided to the one terminal and another voltage, that is an inverted version of the voltage provided to the one terminal, to produce the voltage across the compensation voltage resistor.

* * * * *